United States Patent [19]

Dixon et al.

[11] 4,191,925
[45] Mar. 4, 1980

[54] POWER LINE PROTECTION CIRCUIT

[75] Inventors: Robert P. Dixon, Rustburg; Francis T. Shannon, Lynchburg, both of Va.

[73] Assignee: General Electric Company, Lynchburg, Va.

[21] Appl. No.: 845,887

[22] Filed: Oct. 27, 1977

[51] Int. Cl.$^2$ ............................................. H04B 1/16
[52] U.S. Cl. ................................... 325/474; 325/435; 325/2; 340/169
[58] Field of Search .............. 325/473, 474, 478, 477, 325/435, 431, 402, 2; 340/171 PF, 167 R, 167 B, 172, 169; 178/66 A; 179/175.3 R, 175.3 S; 324/51

[56] References Cited

U.S. PATENT DOCUMENTS

| | | | |
|---|---|---|---|
| 3,982,188 | 9/1976 | Matsuzawa et al. | 325/473 |
| 4,015,206 | 3/1977 | Huntley | 325/402 |

Primary Examiner—Robert L. Griffin
Assistant Examiner—Tommy P. Chin
Attorney, Agent, or Firm—James J. Williams

[57] ABSTRACT

Received power line trip signals are delayed in their tripping function by a circuit which causes introduction of the delay in response to a wideband received signal rising rapidly above a dynamic amplitude level, or in response to a narrowband received signal going outside upper and lower amplitude limits. Either condition could indicate a false trip signal, so that a delay before actual tripping is desirable.

8 Claims, 1 Drawing Figure

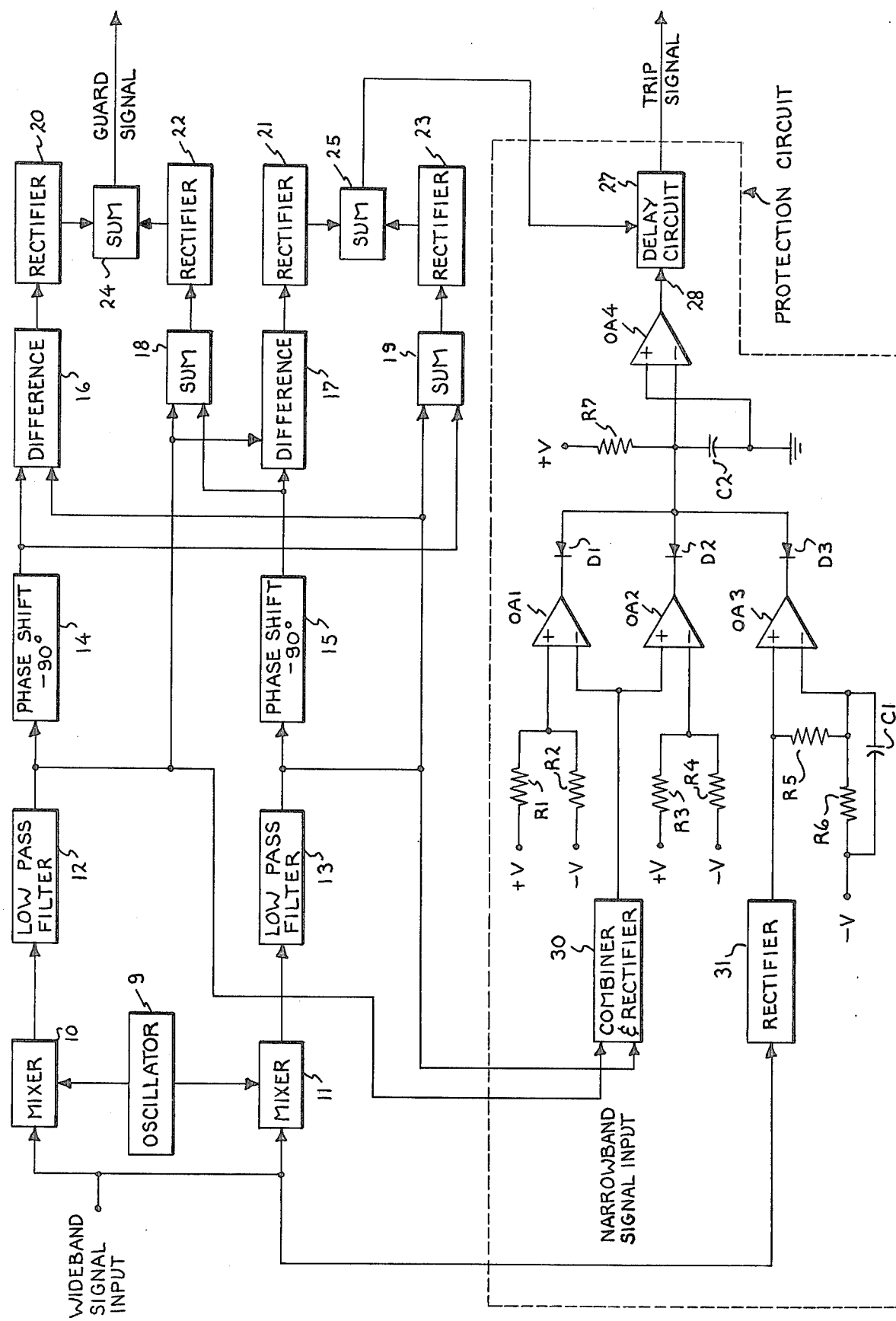

४,१९१,९२५

POWER LINE PROTECTION CIRCUIT

CROSS REFERENCE TO RELATED APPLICATIONS

This application is related to an application entitled "Improved Frequency-Shift-Keyed Receiver" filed Sept. 6, 1977, Ser. No. 830,435, now U.S. Pat. No. 4,156,194, and assigned to the same assignee as this application.

BACKGROUND OF THE INVENTION

Our invention relates to a power line protection circuit, and particularly to a power line protection circuit for delaying trip signals under selected noise conditions.

Frequency-shift-keyed signals are used extensively in 60 Hertz power line systems where line conditions are indicated by frequency-shift-keyed signals. For example, a first power station may supply power over a transmission line to a second station. The second station monitors its loads and other outgoing lines, and as long as these loads and lines are in good condition, the second station sends a first frequency guard signal to the first station. As long as the first station receives this guard signal, it supplies power over the line to the second station. But if the second station detects an improper condition, such as a fault on one of its outgoing lines, the second station removes the guard signal and sends a second frequency trip signal to the first station. Upon loss of the guard signal and upon receipt of the trip signal, the first station trips (or opens) the transmission line to the second station, thereby protecting the equipment at the first station. Because of modern society's need for electrical power, the decision to maintain or open an electrical power line is very important.

Accordingly, a primary object of our invention is to provide a new and improved protection circuit for use in the control of electrical power lines.

Usually, the guard and trip signals are sent and received by carrier frequencies over telephone lines or radio circuits. While telephone lines or circuits are reliable, they are subject to noise. But whatever facility or circuit may be used, its connection or utilization at a 60 Hertz power station makes it inherently noisy from an electrical viewpoint. And when there is a 60 Hertz power or equipment malfunction, the communication facility or circuit may become even noisier, just at the time reliable guard and trip signals are most needed.

Accordingly, another object of our invention is to provide a new power line protection circuit that provides improved operation even under very noisy electrical conditions.

Another object of our invention is to provide a new and improved power line protection circuit that delays a trip signal under certain noise amplitude conditions.

In a protection circuit for 60 Hertz power line systems, the absolute time required for a trip signal to be transmitted, received, and produced is an important design consideration. Of equal importance are the security (against a false trip) and the dependability (for a real trip) of the protection circuit. One prior art protection circuit increased the security (against false trips) with an amplitude squelch circuit and an added fixed time delay in the trip tone receiver. However, the squelch circuit decreased the dependability (for a real trip), and the added fixed time delay decreased the response speed.

Accordingly, another object of our invention is to provide a new and improved power line protection circuit that delays production of a trip signal only when selected noise conditions exist.

Another object of our invention is to provide a new and improved power line protection circuit that utilizes wideband and narrowband noise sensing circuits, and that delays production of a trip signal only when selected conditions exist in either the wideband or the narrowband noise sensing circuits.

SUMMARY OF THE INVENTION

Briefly, these and other objects are achieved in accordance with our invention by a wideband (for example 0 to 3 kilohertz) sensing circuit that produces a control signal in response to the wideband signal amplitudes rising rapidly above a dynamic level. A narrowband (for example 0 to 100 Hertz) sensing circuit produces a control signal in response to the narrowband signal amplitudes falling below or rising above predetermined lower and upper limits. Production of either control signal indicates noise conditions that create an insecure condition with a false trip signal being a possible or likely result. The outputs of the sensing circuits are applied to a time delay circuit which introduces a time delay into the trip signal path in response to generation of either of the control signals. Thus, security against a false trip is provided by introduction of a time delay, but dependability in response to an actual trip is also provided by not introducing a time delay.

BRIEF DESCRIPTION OF THE DRAWING

The subject matter which we regard as our invention is particularly pointed out and distinctly claimed in the claims. The structure and operation of our invention, together with further objects and advantages, may be better understood from the following description given in connection with the accompanying drawing, in which:

The single FIGURE shows a schematic diagram of the preferred embodiment of the protection circuit in accordance with out invention.

DESCRIPTION OF THE PREFERRED EMBODIMENT

Receiver Description

As an example of a frequency-shift-keyed (FSK) receiver with which our invention can be used, we have shown in the upper part of the FIGURE the receiver described and claimed in the above-referenced related application Ser. No. 830,435, filed Sept. 6, 1977, U.S. Pat. No. 4,156,194. However, it is to be understood that our invention can be used with other types of FSK receivers. Such receivers typically receive a wideband voice frequency channel between 300 and 4000 Hertz, although other frequencies can be utilized. If the voice channel is transmitted by a carrier, it is demodulated at the receiving end to the voice frequency band. These demodulated signals are applied to the receiver at the wideband signal input. As an example, the receiver may receive a guard frequency $F_G$ of 2635 Hertz and a trip frequency $F_T$ of 2465 Hertz. In the voice channel, other frequency-shift-keyed information signals may also be supplied, or the remainder of the channel may be used for voice communication. In the receiver shown in the FIGURE, the frequency-shift-keyed (FSK) signals are split by any suitable means, such as a transformer or dual output amplifier, and applied to mixer circuits 10, 11. Each of the mixers 10, 11 is supplied with a mixing signal of a frequency $F_M$ from an oscillator 9. The oscillator may have any form, but a frequency synthesizer having a stable, crystal controlled reference oscillator is preferred so that the mixing frequency $F_M$ may be changed to accommodate different frequencies of FSK signals. The mixing frequency $F_M$ is, in the assumed example, 2550 Hertz, which is midway between the assumed trip frequency (2465 Hertz) and the guard frequency $F_G$ (2635 Hertz). The mixing frequency $F_M$ applied to the mixer 10 is at one phase angle (cosine), and the mixing frequency $F_M$ applied to the mixer 11 is shifted 90 degrees (sine) with respect to the one phase angle. The mixers 10, 11 produce sum and difference frequencies, and the outputs of the two mixers 10, 11 have a 90 degree phase relation or difference. These outputs are applied to lowpass filters 12, 13 respectively which provide the desired channel selectivity and the narrowband signals for our circuit. In the assumed example, the filters 12, 13 could cut off or attenuate frequencies above about 90 Hertz. For such filters, the sum frequencies from the mixers 10, 11 would be eliminated, and only the difference frequencies (namely 2635−2550 or 85 Hertz, and 2550−2465 or 85 Hertz) or lower frequencies would be passed.

Signals from the lowpass filter 12 are applied to a phase shift circuit 14 which introduces a phase shift of −90 degrees. Signals from the lowpass filter 13 are applied to a phase shift circuit 15 which also introduces a phase shift of −90 degrees. These phase shift circuits 14, 15 may take any suitable form known in the art, as long as they introduce a 90 degree phase shift to the 85 Hertz difference frequency, and other phase shifts to other frequencies (which would be considered noise) below or above 85 Hertz. An example of the phase shift circuit would be a differentiator, an integrator, or an allpass phase shifter which introduces −90 degrees phase shift to the difference frequency of 85 Hertz, and which introduces a phase shift which changes with decreasing frequencies. A difference circuit 16 is provided and has one input connected to the output of the phase shift circuit 14, and the other input connected to the ouput of the lowpass filter 13. A sum circuit 18 is provided and has one input connected to the output of the lowpass filter 12, and the other input connected to the output of the phase shift circuit 15. A difference circuit 17 is provided and has one input connected to the output of the low pass filter 12, and the other input connected to the output of the phase shift circuit 15. And a sum circuit 19 is provided and has one input connected to the output of the lowpass filter 13, and the other input connected to the output of the phase shift circuit 14. Each of the difference circuits 16, 17 may be an operational amplifier having its two inputs connected as shown to provide an output which represents the difference in the two inputs. Each of the sum circuits 18, 19 may also be an operational amplifier having one input connected to two outputs through respective isolating resistors, and having the other input connected to a reference voltage. In the FIGURE, it will be noted that the inputs to the difference circuit 16 and the sum circuit 19 are derived from the same outputs, and that the inputs of the sum circuit 18 and the difference circuit 17 are also derived from the same outputs. Thus, the circuits 16, 19 are connected to the phase shift circuit 14 and the low pass filter 13, but the circuits 18, 17 are connected to the low pass filter 12 and the phase shift circuit 15. This varies or randomizes the effects of noise signals whose frequencies are less than the 85 Hertz cutoff of the lowpass filters 12, 13 but treats the 85 Hertz tone signals substantially the same.

The outputs of the difference circuit 16 and the sum circuit 18 are applied to respective full wave rectifiers 20, 22. The outputs of these rectifiers 20, 22 are applied to a sum circuit 24 which adds the voltages applied to it by the rectifiers 20, 22. Similarly, the outputs of the difference circuit 17 and the sum circuit 19 are applied to respective full wave rectifiers 21, 23, and the outputs of these rectifiers 21, 23 are applied to a sum circuit 25. The outputs of the sum circuits 24, 25 may be filtered to reduce or smooth any ripple voltages which may be present. The sum circuit 24 produces a guard signal in response to the guard frequency $F_G$ (assumed to be 2635 Hertz), and the sum circuit 25 produces a trip signal in response to the trip frequency $F_T$ (assumed to be 2465 Hertz).

As mentioned in the preceding background of our invention, a trip signal typically causes removal of a very significant amount of power transmission equipment, and may cut off 60 Hertz electrical power from a large number of customers. Consequently, it is very important that a trip signal be allowed to function only when an actual trip condition is present. Prior art circuits have introduced a fixed delay but a fixed delay has the disadvantage that a true trip signal received under low noise conditions is unnecessarily delayed, with the result that power transmission equipment may be damaged.

Protection Circuit Description

Our protection circuit is shown enclosed in dashed lines in the FIGURE. In accordance with our invention, we provide a delay circuit 27 which, when operated by a positive signal at its control input 28, introduces a delay to the trip signal. This delay is provided when the narrowband signal amplitude rises above an upper limit or falls below a lower limit, or when the wideband signal increases in amplitude at a rate that exceeds the time constant of a dynamic reference level or voltage. The narrowband signals are derived from the outputs of either, or preferably both, of the filters 12, 13. As mentioned above, the outputs of the mixers 10, 11, and hence the filters 12, 13, have a 90 degree phase relation. These two filter signals are combined and then rectified in a circuit 30 to provide a negative dc voltage. Because the two signals have a 90 degree phase relation, they have only a small amount of ripple when rectified. Since the rectified output is not filtered, the dc voltage quickly follows any amplitude change in the two signals. This negative dc voltage is applied to the minus input of an operational amplifier OA1 and to the plus input of an operational amplifier OA2. The amplifiers OA1, OA2 are connected as differential amplifiers. The plus input of the amplifier OA1 is connected to the junction of two resistors R1, R2 connected to series between a positive direct current voltage $+V$ and a negative direct current voltage $-V$. The minus input of the amplifier OA2 is connected to the junction of two resistors R3, R4 connected in series between the same voltages $+V$ and $-V$. In an actual embodiment, the voltage $+V$ was $+12$ volts and the voltage $-V$ was $-12$ volts with respect to ground or a reference. The resistors R1, R2 were selected so that the plus input to the amplifier OA1 was at approximately $-1$ volt, and the resistors R3, R4 were selected so that the minus input of the amplifier OA2 was at approximately $-5$ volts. The output of the rectifier 30 was made negative with respect to ground or reference potential, and if this output was above −1 volt (that is, it approached 0 because of a small signal amplitude), the amplifier OA1 produced a negative output. If the output of the rectifier 30 was below −5 volts (because of a large signal amplitude), then the amplifier OA2 produced a negative output. If the output of the rectifier 30 had an amplitude between −1 volt and −5 volts, the outputs of the amplifiers OA1, OA2 were both positive. When either of the amplifiers OA1, OA2 produces a negative output, this output is passed by a respective isolating diode rectifier D1 or D2 and applied to the minus input of an output operational amplifier OA4. The plus input of the amplifier OA4 is connected to the ground or reference, and the minus input of the amplifier OA4 is connected through a resistor R7 to the voltage +V, which keeps the minus input normally positive so that the output of the amplifier OA4 is normally negative. This minus input may also have a capacitor C2 connected to ground so that when one or both of the amplifiers OA1, OA2 produces a negative output, the minus input of the amplifier OA4 is kept negative for a predetermined time after the negative output from the amplifiers OA1, OA2 is removed. When the minus input of the amplifier OA4 becomes negative, the amplifier OA4 produces a positive output which is applied to the control input 28 of the delay circuit 27. The delay circuit 27 may take any suitable form that responds to this positive input to introduce a predetermined time delay, for example 8 milliseconds. When the positive input is removed, the introduced time delay is immediately removed. An example of a delay circuit would be a capacitor and a transistor connected in series between the trip signal output line and ground. The transistor is turned on by a positive output from the amplifier OA4 to insert the capacitor across the trip signal output line and introduce a delay. Other forms of delay circuits may be provided. In summary, when the narrowband signal amplitude rises above an upper level or falls below a lower level, one of the amplifiers OA1, OA2 produces a negative output for the duration of that condition. The amplifier OA4 produces a positive output for that same duration plus the predetermined time added by the capacitor C2. This positive output causes the delay circuit 27 to become operative and introduce a delay to signals applied to the circuit 27.

The received wideband signals are applied directly to a full wave rectifier 31 which also produces negative dc signals. These signals are applied to the plus input of an operational amplifier OA3 connected as a differential amplifier. The plus input is connected through two series resistors R5, R6 to the voltage −V, and the minus input is connected to the junction of these resistors R5, R6. The minus input is also connected through a capacitor C1 to the voltage −V. The capacitor C1, along with the resistor R6, sets a dynamic voltage reference level which changes in response to changes in the output of the rectifier 31. This reference level thus changes with slower changing line and signal conditions so as to be sensitive to noise burst conditions. This sensitivity results from the fact that the reference level has a selected time constant which does not instantaneously follow rapid changes in the output of the rectifier 31. Typically, such rapid changes represent noise. If a burst of noise whose amplitude exceeds the dynamic reference level is received, the output of the rectifier 31 becomes more negative. If the burst is rapid, the output of the rectifier 31 becomes more negative so quickly that the capacitor C1 can not charge soon enough to prevent the minus input of the amplifier OA3 from momentarily being more positive than the plus input. As a result, the amplifier OA3 produces a momentary negative output. This negative output is passed by an isolating diode rectifier D3, which in turn causes the amplifier OA4 to produce a positive output. This positive output causes the time delay circuit 27 to introduce a time delay to any trip signal present.

In summary, it will be seen that out protection circuit introduces a time delay to a trip signal in response to a narrowband signal amplitude rising above a predetermined upper limit or falling below a predetermined lower limit, a condition that indicates inband noise or loss of signal. Similarly, our protection circuit introduces a time delay whenever the wideband signal changes amplitude rapidly above a dynamic level. Either condition introduces a delay to a trip signal present. However, if the inband signal amplitude is within the predetermined upper and lower limits, and if the wideband signal does not change amplitude more rapidly than the dynamic reference, then no delay is introduced, and a trip signal will be rapidly produced.

In an actual embodiment constructed in accordance with our invention, with the +12 and −12 voltages, the resistors R1, R2 were selected to set a lower limit of −1 volt of signal amplitude, and the resistors R3, R4 were selected to set an upper limit of −5 volts in signal amplitude. The resistors R5, R6 and the capacitor C1 had values forming a low pass filter whose time constant was relatively long, for example 100 milliseconds.

It will thus be seen that we have provided a new and improved protection circuit which increases the security of power line systems against false trips, but which introduces a time delay in the presence of certain selected noise conditions. While we have shown only one embodiment of our invention, persons skilled in the art will appreciate that many modifications may be made. First, it is important to note that our protection circuit can be used with various types of receivers, as long as wideband and narrowband signals can be obtained. And, the actual bandwidth of these signals may differ from the mentioned 0 to 90 Hertz for the narrowband signals and 300 to 4000 Hertz for the wideband signals. Various types of differential amplifiers can be used, and the voltage rectifications and comparisons can be made in a positive sense rather than in the negative sense described. Our actual embodiment used the negative voltages because of the particular receiver requirements. The guard signal may be used independently as shown, or may be logically combined with the trip signal ahead of the circuit 27, and delayed also. And finally, the delay circuit may have various forms and have various time delays. Therefore, while our invention has been described with reference to a particular embodiment, it is to be understood that modifications may be made without departing from the spirit of the invention or from the scope of the claims.

What we claim as new and desire to secure by Letters Patent of the United States is:

1. In a signal receiver for receiving relatively narrowband information signals in a relatively broad band of signals and producing said information signals at an output, an improved circuit comprising:
   a. first means for producing a first signal whose amplitude is indicative of the amplitude of said relatively broad band signals;

b. second means connected to said first means for producing a control signal in response to the amplitude of said first signal rapidly exceeding a dynamic reference level determinated by said relatively broad band signals;
c. third means for producing a second signal whose amplitude is indicative of the aplitude of said relatively narrowband signals;
d. fourth means connected to said third means for producing a control signal in response to the amplitude of said second signal going outside predetermined upper and lower limits;
e. and fifth means connected to said second and fourth means for delaying said information signals in response to either of said control signals.

2. The improved circuit of claim 1 wherein said delaying is for a predetermined time in response to each occurrence of either of said control signals.

3. An improved protection circuit for use with apparatus which produces guard and trip signals in response to relatively narrowband guard and trip frequency signals transmitted over a communication circuit, said protection circuit comprising:
a. first means for deriving a relatively wide band of signals from said communication circuit;
b. second means connected to said first means for producing a first reference level indicative of the amplitude of said wide band of signals, said first reference level reponding to changes in said amplitude of said wide band of signals at a first predetermined rate;
c. third means connected to said first and second means for producing a delay signal in response to changes in said amplitude of said wide band of signals at a second rate that exceeds said first rate;
d. fourth means for deriving at least said relatively narrowband trip signals;
e. fifth means for producing upper and lower reference levels;
f. sixth means connected to said fourth and fifth means for producing a delay signal in response to the amplitude of said narrowband trip signals rising above said upper reference level and for producing a delay signal in response to the amplitude of said narrowband trip signals falling below said lower reference level;
g. and output means connected to said third and sixth means for introducing a delay to trip signals produced by said apparatus in response to each of said delay signals.

4. The improved protection circuit of claim 3 wherein said second means comprise a resistor and capacitor timing circuit.

5. The improved protection circuit of claim 3 wherein said third means comprise a differentiator circuit having a first input connected to said first means, having a second input connected to said second means, and having an output which produces said delay signal.

6. The improved protection circuit of claim 3 wherein said sixth means comprise a first differentiator circuit having a first input connected to said fourth means and a second input connected to an upper reference level for producing a delay signal in response to said narrowband signal exceeding said upper reference level, and a second differentiator circuit having a first input connected to said fourth means and a second input connected to a lower reference level for producing a delay signal in response to said narrowband signal falling below said lower reference level.

7. The improved protection circuit of claim 4 wherein said third means comprise a differentiator circuit having a first input connected to said first means, having a second input connected to said second means, and having an output which produces said delay signal.

8. The improved protection circuit of claim 7 wherein said sixth means comprise a first differentiator circuit having a first input connected to said fourth means and a second input connected to an upper reference level for producing a delay signal in response to said narrowband signal exceeding said upper reference level, and a second differentiator circuit having a first input connected to said fourth means and a second input connected to a lower reference level for producing a delay signal in response to said narrowband signal falling below said lower reference level.

* * * * *